United States Patent [19]

Fling et al.

[11] Patent Number: 4,591,832
[45] Date of Patent: May 27, 1986

[54] DIGITAL-TO-ANALOG CONVERSION SYSTEM AS FOR USE IN A DIGITAL TV RECEIVER

[75] Inventors: Russell T. Fling, Fishers; Donald H. Willis, Indianapolis, both of Ind.

[73] Assignee: RCA Corporation, Princeton, N.J.

[21] Appl. No.: 631,868

[22] Filed: Jul. 18, 1984

[51] Int. Cl.⁴ ............................................. H03M 1/12
[52] U.S. Cl. .......................... 340/347 DA; 340/347 R
[58] Field of Search ................................ 340/347 DA

[56] References Cited

U.S. PATENT DOCUMENTS

| 4,410,879 | 10/1983 | Gumm et al. | 340/347 DA |
| 4,430,642 | 2/1984 | Weigand et al. | 340/347 DA |
| 4,450,433 | 5/1984 | Moriyama | 340/347 DA |

FOREIGN PATENT DOCUMENTS 2107145A 4/1983 United Kingdom .

OTHER PUBLICATIONS

"Analog-Digital Conversion Handbook", published by Analog Devices, Inc., Norwood, Mass., 02062, 1972.

Primary Examiner—Bernard Roskoski
Assistant Examiner—Saul M. Bergmann
Attorney, Agent, or Firm—Eugene M. Whitacre; Paul J. Rasmussen; Eric P. Herrmann

[57] ABSTRACT

A digital-to-analog converter system includes two DAC's operated in ping pong fashion with their analog output signals linearly summed. To preclude bandwidth limiting inherent in the summing operation the applied digital input signal is preconditioned in accordance with the transfer function $1/(1+Z^{-1})$.

20 Claims, 6 Drawing Figures

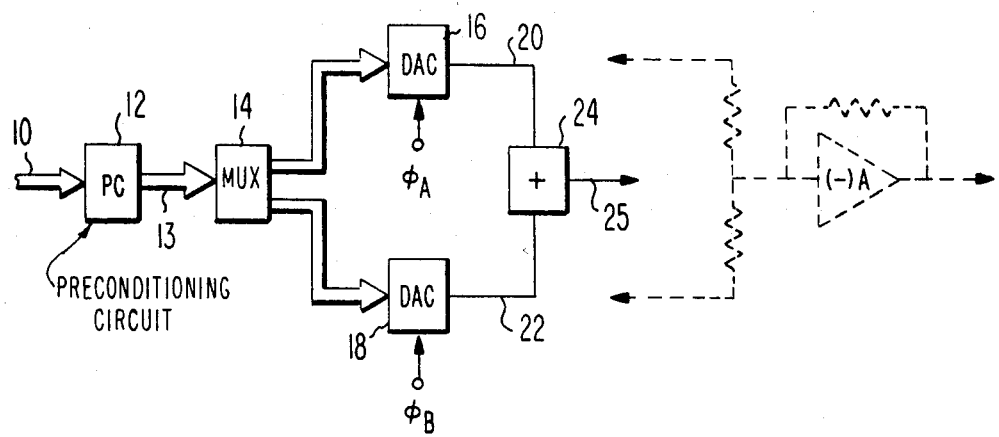
Fig.1
| x(nt) | --- | $X_{n-2}$ | $X_{n-1}$ | $X_n$ | $X_{n+1}$ | $X_{n+2}$ | $X_{n+3}$ | -- |
|---|---|---|---|---|---|---|---|---|
| S1 | --- | $X_{n-2}$ | | $X_n$ | | $X_{n+2}$ | | -- |
| S2 | $X_{n-3}$ | | $X_{n-1}$ | | $X_{n+1}$ | | $X_{n+3}$ | -- |
| Y(nt) | $A_{n-3}$ + $A_{n-2}$ | $A_{n-2}$ + $A_{n-1}$ | $A_{n-1}$ + $A_n$ | $A_n$ + $A_{n+1}$ | $A_{n+1}$ + $A_{n+2}$ | $A_{n+2}$ + $A_{n+3}$ | | -- |
| | $Y_{n-2}$ | $Y_{n-1}$ | $Y_n$ | $Y_{n+1}$ | $Y_{n+2}$ | $Y_{n+3}$ | | |
Fig.2
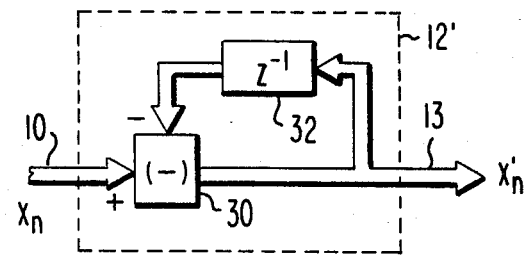
Fig.3

DIGITAL-TO-ANALOG CONVERSION SYSTEM AS FOR USE IN A DIGITAL TV RECEIVER

BACKGROUND OF THE INVENTION

This invention relates to digital-to-analog converter systems (DAC's) and more particular to apparatus to enhance the effective bandwidth of bandwidth limited DAC's.

The invention will be described in the environment of digital video signal processing systems, but will be recognized to have more general applicability. Recent advances in integrated circuit design and processing have made possible the realization of TV receivers in which the video signal is processed digitally. Typically, baseband composite video signal at the tuner is sampled at four times the color subcarrier (e.g. 14.32 MHz for NTSC systems) and converted to binary format. The binary representation of the video signal is processed in arithmetic devices to ultimately develop R, G, B color signals for driving an image display tube. Input signals to currently available display tubes are required to be analog signals, thus, at some point the processed binary signals must be converted back to analog form. This operation is performed by DAC's which operate at the sample rate of 14.3 MHz.

To enhance the image quality of certain of these digital receivers it is desired to display twice the number of horizontal image lines normally displayed in a field while maintaining the number of fields displayed per second constant. This requirement doubles the rate of samples which must be processed by the DAC's. The sample rate is increased to approximately 28.6 MHz for NTSC signals (and approximately 35 MHz for PAL signals).

DAC's exist, in for example bipolar technology, capable of processing signals at these higher rates. However, they are expensive and dissipate relatively large amounts of power. The majority of the digital video signal processing elements in the digital receiver tend to be insulated gate field effect or MOS devices. MOS DAC's are presently capable of processing the binary video samples at the lower rates, e.g. 14 MHz, but not at the doubled rate. Yet it is desirable, for power dissipation and integrated circuit interfacing reasons, to use MOS DAC's.

If you have devices that operate at one-half the desired rate, one solution is to time division multiplex two such devices operating in parallel. However, time division multiplexing the output signals of two DAC's at a 28 MHz rate is not easily accomplished. Significant switching signals are coupled into the multiplexed analog signal and the DAC's must have matched DC parameters not to introduce switching rate harmonics.

It is an object of the present invention to operate two DAC's in parallel at half the input sample rate, and to combine the output signals from the DAC's without multiplexing, thus, eliminating switch transient contamination and DC offset problems.

SUMMARY OF THE INVENTION

The present digital-to-analog converter system includes two DAC's operating in parallel and at one-half the output sample rate. The output terminals of the DAC's are coupled to an analog signal summing circuit which provides the DAC system analog output signal. Summing successive pairs of signal samples has the effect of rolling off higher frequency signal spectral components. Therefore, digital input samples applied to the DAC system are coupled to a signal conditioning element which transforms the input samples according to the function, F, given by the equation $$F = (1 + Z^{-1})^{-1}.$$

The preconditioned samples are alternately applied to the input ports of the two parallel DAC devices. The combined output signals from the parallel DAC's have substantially the same frequency response as the signal represented by the digital input samples.

BRIEF DESCRIPTION OF THE DRAWINGS

FIGS. 1 and 5 are block diagrams of digital-to-analog converter systems having two DAC's operating in parallel at half the sample rate and including means for additively combining their output signals;

FIG. 2 is a timing diagram of signal samples occurring in the FIG. 1 circuit;

FIGS. 3 and 6 are preconditioning circuits for preconditioning digital samples applied to the FIG. 1 DAC's.

DETAILED DESCRIPTION

Figure 4:
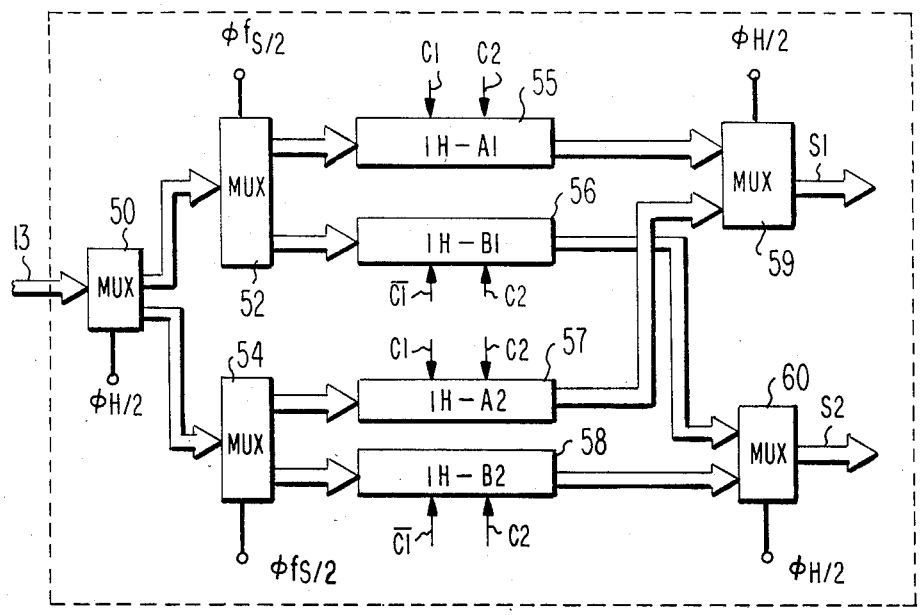
FIG. 4 is a signal speed-up circuit for selectively coupling input samples to, e.g. the FIG. 1 DAC's.

In the drawings, the broad arrows indicate parallel multibit busses, and the narrow arrows indicate either single analog signal connections or busses, or clocking signal connections. Elements in the different figures designated with like numerals are like elements or perform similar functions.

Referring to FIG. 1 digital samples, (e.g. PCM binary samples in the luminance signal processing channel of a digital TV receiver) are applied at input 10 and coupled to a signal preconditioner 12. Preconditioned samples on bus 13 are alternately applied via multiplexor 14 to DAC's 16 and 18. Multiplexor 14 is controlled by clock pulses $\phi 1$, occurring synchronously with the signal samples and applied at terminal $\phi 1$. Alternatively, if DAC's 16 and 18 are of the type that strobe in their respective input samples, for example under control of antiphase synchronous clock pulses supplied to terminals $\phi A$ and $\phi B$, then multiplexor 14 may be eliminated and the input ports of DAC's 16 and 18 connected in parallel.

The output signals, from DAC's 16 and 18 on connections 20 and 22 respectively, are sampled analog signals, i.e. they exhibit a quantized amplitude that remains substantially constant for the duration of the input sample period (or the control pulse ($\phi A$, $\phi B$) period). These quantized analog samples are applied to analog summing circuit 24 which produces the system output signal at terminal 25. Summing circuit 24 may be a circuit such as the one shown in phantom lines to the right thereof.

It will be understood that the operating phase of DAC 16 is offset from that of DAC 18 or else the output signal frequency can be no higher than one-half the sample rate applied to one of the DAC's. This will be clarified by reference to FIG. 2.

In FIG. 2 the row designated X(nt) is an exemplary sequence of digital input samples applied at terminal 10 with time running from left to right. The rows designated S1 and S2 are the input sample sequences directed to DAC 16 and DAC 18 respectively. For purposes of this discussion it is presumed that element 12 has a unit transfer function. Finally, the row designated Y(nt) is the sequence of analog output samples at terminal 25. The values $A_{n+i}$ are the analog representations of the respective binary values $X_{n+i}$. The sums at each time interval Y(nt) are derived simply by adding the S1, S2 samples currently in DAC 16 and 18 for the requisite time period.

First, note that were the samples S1 and S2 occurring in phase, the output sums would occur at the S1 or S2 rate and not the desired higher rate of the X(nt) samples.

Secondly, for most DAC systems, it is desired that the frequency response be at least as good as the input frequency content. That is, from terminal 10 to terminal 25 the frequency response should not roll off. However, according to FIG. 2

$$Y(n) = A_n + A_{n-1} \quad (1)$$

but $$A_{n+i} = X_{n+i}$$

so $$Y(n) = X_n + X_{n-1} \quad (2)$$

or in the conventional "Z" transform notation $$Y_n = X_n(1 + Z^{-1}). \quad (3)$$

This indicates a cosine transfer function with nulls occurring at one-half the sample frequency and multiples thereof. In the signal spectrum of interest, the transfer function is a low pass filter function.

This low pass filter effect may be prevented by preconditioning the samples with a complementary transfer function prior to demultiplexing the sample sequence in multiplexor 14. The complementary function for this embodiment is $(1+Z^{-1})^{-1}$. Circuitry to develop the complementary function is illustrated in FIG. 3 and consists of a subtractor 30 and a delay element 32 having a one sample delay. Input samples $X_n$ applied at input port 10 are coupled to the subtractor 30 wherein differences $X_n'$ output by subtractor 30 and delayed by one sample period in element 32 are subtracted from the values $X_n$. The differences $X_n'$ are the preconditioned values. From FIG. 3

$$X_n' = X_n - X_n'Z^{-1} \quad (4)$$
$$X_n' + X_n'Z^{-1} = X_n$$
or $$X_n' = X_n/(1 + Z^{-1}) \quad (5)$$
finally $$X_n'/X_n = 1/(1 + Z^{-1})$$

which is the desired function. Substituting $X_n'$ from equation (5) into equation (3) yields $Y_n = X_n$ or the unity transfer function.

It readily follows from FIG. 2 and equation (3) that if N DAC's are operated in parallel in the manner described that the requisite preconditioning function applied to the input samples will be $$\left[ \sum_{i=0}^{N-1} A_i Z^{-i} \right]^{-1}$$

where the $A_i$ are arbitrary coefficients. For example, for $N=2$, $A_0=1$ and $A_1=1$.

Referring again to the video signal processing environment, assume that element 14 of FIG. 1 includes circuitry to double the line rate of the signals for displaying signals in what is termed the line progressive scan mode. In general, line progressive scan implies doubling the number of lines displayed in a video field period. The added lines are inserted between respective pairs of successively displayed lines (relative to a normally reproduced image). One method of generating the extra lines of video signal is to average the signal of the respective pairs of successive lines on a point by point basis. The lines of signal created by this approach are termed interpolated lines. A second method of producing the intermediate lines is simply to display each line of video signal twice in succession at twice the normal rate.

FIG. 4 is circuitry which may be substituted for element 14 in FIG. 1 to provide for progressive scan signals by the second method. In FIG. 4, signal having the normal sample rate $f_s$ is applied at input port 13 and signals having the same sample rate, $f_s$, occur at output ports S1 and S2 so that the sample rate of combined signals S1' and S2' is twice $f_s$. There are four delay lines 55–58 which each have data input at the rate of $f_s/2$ and data read out at $f_s$. In operation, one horizontal line of video signal is routed via multiplexor 50 to multiplexor 52. Multiplexor 52 applies even numbered samples to the A1 register 55 and odd numbered samples to the B1 register 56. Since the input samples are split between two registers, the registers operate at one-half the input sample rate.

While the current line of video signal is being loaded in registers 55 and 56, the lastmost prior line of video signal previously loaded in registers 57 and 58, is read out twice in succession at the $f_s$ sample rate to provide a twice rate signal. The FIG. 4 circuit operates in "ping pong" manner with signal being read into delay lines 55 and 56 while signal is read out of delay elements 57 and 58. The roles of these devices then reverse.

An A channel and a B channel are incorporated in order than none of the devices be required to operate at a sample rate greater and the normal video sample rate $f_s$. Note that were one of the A or B channels eliminated, multiplexors 52 and 54 would be eliminated, and multiplexors 59 and 60 would be changed from two-input-one output devices to one-input-two-output devices in order that alternate samples in, e.g. delay element 55, be directed to the S1 and S2 output ports.

If a DAC capable of throughputting samples at the $2f_s$ rate were available, it may still be advantageous to parallel two such devices, e.g. in conjunction with a FIG. 4 type circuit, in order that the system clocks operate at a rate no higher than $f_s$. One particular reason for this is to minimize RFI which may be generated in the video signal processor. Secondly, the slower the component parts are clocked, the easier they are to maintain synchronized.

The use of A and B channels has interesting ramifications regarding the preconditioning circuitry. It will be appreciated by those skilled in the art of digital signal processing that the FIG. 3 preconditioning circuitry increases the word length of the signal samples, $X_n'$, by one bit. This undesirably significantly increases the required size of delay elements 55–58. In order not to increase the size of the delay elements 55–58 the signal preconditioning may be performed after speed-up, but this requires preconditioning at, e.g. 28 MHz, which is undesirable also. A second method is to precondition signals applied to the A channel prior to speed-up and to precondition signal applied to the B channel after speed-up. In this instance only two of the four delay elements are increased in size and all preconditioning is performed at the normal rate.

Figure 5:
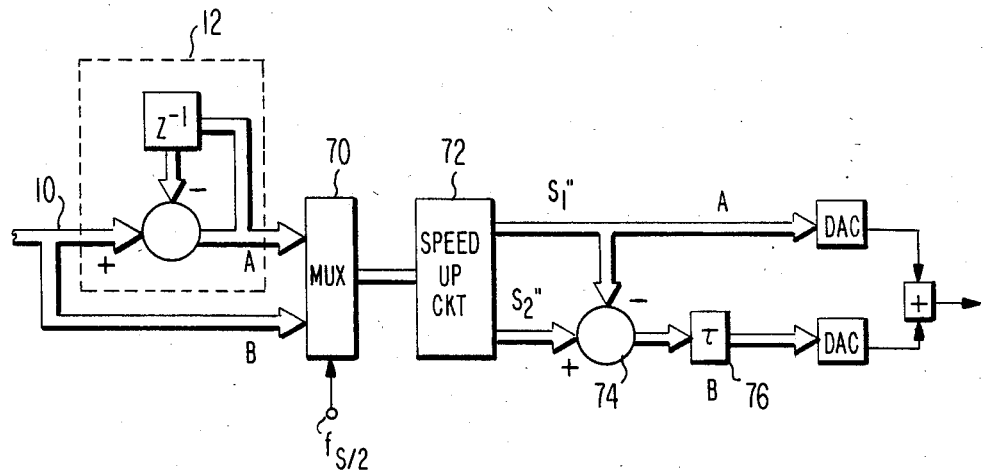

FIG. 5 illustrates the preconditioning circuitry where samples in the A channel are preconditioned prior to speed-up and B channel samples are preconditioned after speed-up. All of the input samples are applied to the preconditioning circuit 12 which generates peconditioned A and B samples. The samples from element 12 are applied to one input port of a multiplexor circuit 70 and non-conditioned input samples are applied to a second input port of multiplexor 70. Multiplexor 70 is clocked synchronously with the input samples and at one-half the rate thereof to alternately select preconditioned samples from circuit 12 and unconditioned samples from input port 10 for application to the channel delay elements.

Signal samples processed in the A channel of speed-up circuit 72 are applied directly to the A channel DAC. The A channel samples are also applied to a binary subtractor 74 coupled to receive B channel signals from circuit 72, wherein preconditioned A samples are subtracted from unconditioned B channel samples. The difference samples produced by subtractor 74 are exactly equal in value to B channel values generated in preconditioning circuit 12. Thus, there is no loss in signal processing accuracy. To perform the subtraction in subtractor 74, the A and B channels must be read out in phase so that both A and B samples occur simultaneously at subtractor 74. As a consequence, one or the other of the preconditioned A and B samples must be delayed by one-half of the $f_s$ sample period before being applied to the respective DAC. In FIG. 5 the B samples are delayed in delay element 76 for this purpose.

At the expense of slight signal processing accuracy, the preconditioned A samples may be applied to the speed-up circuitry with the least significant bit, LSB, truncated in order to reduce the size of the A channel delay elements. All even valued A samples will remain correct. The odd values of A samples which were truncated, will in general, not generate erroneous sums at the system output because of offsetting one LSB errors formed in the B preconditioned samples. Some 1-LSB errors are generated during step responses but there are no steady state DC errors created.

The preconditioning circuit illustrated in FIG. 3 is a recursive filter which has a pole at the frequency equal to one-half the sample rate. The pole may create instabilities since the circuit gain is infinite at the pole frequency. In addition, the filter may exhibit undesirable oscillations for steady state signals.

Figure 6:
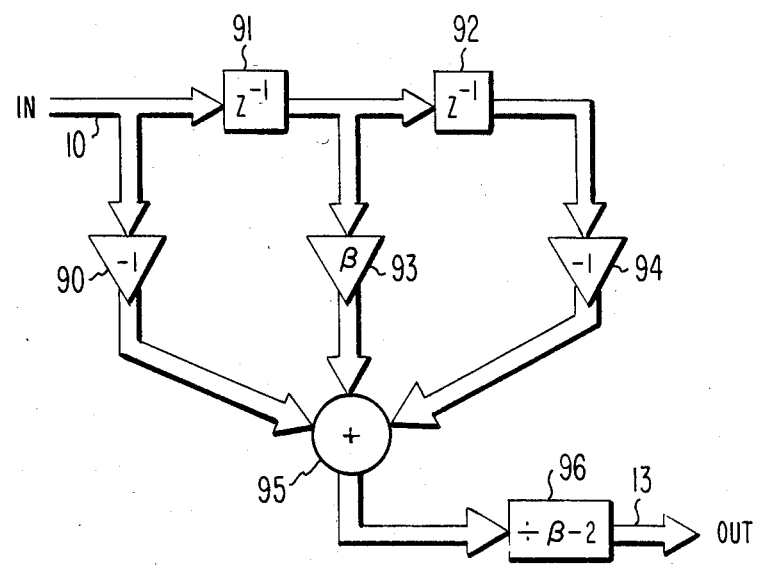

FIG. 6 illustrates a sample preconditioning circuit which may be substituted for the FIG. 3 circuit. The FIG. 6 circuit is a non-recursive system and is inherently stable. The transfer function of the FIG. 6 circuit can be tailored to produce a result similar to the FIG. 3 circuit or it may be arranged to e.g. peak a certain frequency spectrum of the applied signal.

In FIG. 6, input samples at input port 10 are coupled to cascade connected delay elements 91 and 92 which respectively delay signal samples by one sample period. Input samples and samples from delay element 92 are respectively complemented (inverted in polarity) in weighting circuits 90 and 94. Samples from delay element 91 are scaled by the factor $\beta$ in weighting circuit 93. Scaled and inverted samples from circuits 90, 93 and 94 are summed in adder circuit 95, the output of which exhibits the preconditioning circuit transfer function $-1+\beta Z^{-1}-Z^{-2}$. Output samples from adder circuit 95 are applied to circuit 96 which divides the summed samples by e.g. $\beta-2$, in order to normalize the values output by the preconditioning circuit.

For the scale factor $\beta$ having a value of 10, the transfer function of FIG. 6 approximates the transfer function of FIG. 3. Note also for $\beta$ equal to 10 the divisor of normalizing circuit 96 is equal to 8. In this instance, division may be accomplished by shifting the sample bits rightward three significant bit positions (requiring no additional hardware).

Selecting $\beta$ to have a value of 6, for example, will result in the DAC system having a peaked response of about ten percent in the frequency range between 2.8 and 3.2 MHz (for a 14.28 MHz sample rate) which may be desirable for enhancing high frequency luminance signal. In this instance the normalizing divisor is 4, and the division may be performed by shifting the bit positions of the sums two significant bit positions rightward.

The FIG. 3 and FIG. 6 sample preconditioning circuits are to be construed as exemplary. Armed with the foregoing, those skilled in the art of digital systems design will be able to synthesize alternate preconditioning circuits without straying from the spirit of the invention and the claims should be construed in this light.

What is claimed is:

1. A signal processing system for converting digital signal samples, occurring at a prescribed rate, to an analog signal representing the values of said digital samples, comprising:

an input terminal for applying said digital samples;

first and second digital-to-analog converters having respective analog output terminals and respective digital signal input ports;

means coupled to the analog output terminals of said first and second digital-to-analog converters for additively combining signals provided thereat, to generate an analog output signal from said signal processing systems;

means coupled to said input terminal for preconditioning applied digital input samples according to the function $(1+Z^{-1})^{-1}$ where Z connotes the conventional Z-transform variable; and means coupled to said signal preconditioning means for alternately applying ones of the preconditioned digital input samples to the input ports of said first and second digital-to-analog converters, wherein said first digital-to-analog converter is conditioned to provide converted samples delayed, by one-half the output analog sample period, from sample conversions provided by said second digital-to-analog converter.

2. The signal processing system set forth in claim 1 wherein the means for preconditioning applied digital samples comprises:

a subtractor circuit having a minuend input port coupled to said input terminal, having a subtrahend input port and having an output port at which said preconditioned samples are available; and a delay element, for delaying samples by one sample period, coupled between said subtractor output port and the subtrahend input port.

3. The signal processing system set forth in claim 1 wherein the means for preconditioning applied digital samples comprises:

a subtractor having a minuend input coupled to said input terminal, a subtrahend input port and an output port;

a delay element coupled between said subtractor output port and subtrahend input port; and a multiplexor having first and second signal input ports respectively coupled to said input terminal and said subtractor output port for providing samples alternately selected from said input terminal and said subtractor output port.

4. The signal processing system set forth in claim 3 wherein the means for preconditioning applied digital samples comprises:

a further subtractor having a minuend input port coupled to said multiplexor for selectively applying samples which were selected from said input terminal, having a subtrahend input port coupled to said multiplexor for selectively applying samples which were selected from said subtractor output port and having an output port at which preconditioned samples are available for application to one of said first and second digital-to-analog converters.

5. The signal processing system set forth in claim 1 wherein the means for alternately applying the preconditioned samples to the first and second digital-to-analog converters includes:

first, second, third and fourth delay elements, said delay elements respectively having delay periods substantially greater than one sample period and conditioned to write in samples at a first rate and to read out samples at a second rate;

first multiplexing means having an input port and first and second output ports for applying samples applied to said multiplexing means input port alternately to said first and second delay elements;

second multiplexing means having an input port and first and second output ports for applying samples applied to said second multiplexing means input port alternately to said third and fourth delay elements;

third multiplexing means having an input port coupled to said preconditioning means and having first and second output ports respectively coupled to said input ports of said first and second multiplexing means for alternately applying strings of samples to said first and second multiplexing means;

fourth multiplexing means having first and second input ports respectively coupled to said first and third delay elements and having an output port coupled to said first digital-to-analog converter and conditioned to alternately couple strings of delayed samples from said first and third delay elements to said first digital-to-analog converter; and fifth multiplexing means having first and second input ports respectively coupled to said second and fourth delay elements and an output port coupled to said second digital-to-analog converter, and conditioned to alternately couple strings of delayed samples from said second and fourth delay elements to said second digital-to-analog converter.

6. A signal processing system for converting digital signal samples, occurring at a prescribed rate, to an analog signal representing the values of said digital samples, comprising:

an input terminal for applying said digital samples;

means coupled to said input terminal for preconditioning applied digital input samples according to the function $(-1+\beta Z^{-1}-Z^{-2})/(\beta-2)$ where Z connotes the conventional Z-transform variable and $\beta$ is a constant scale factor; and first and second digital-to-analog converters having respective analog output terminals and respective digital signal input ports;

means coupled to the analog output terminals of said first and second digital-to-analog converters for additively combining signals provided thereat, to generate an analog output signal from said signal processing systems;

means coupled to said signal preconditioning means for alternately applying ones of the preconditioned digital input samples to the input ports of said first and second digital-to-analog converters, wherein said first digital-to-analog converter is conditioned to provide converted samples delayed, by one-half the output analog sample period, from sample conversions provided by said second digital-to-analog converter.

7. The signal processing system set forth in claim 6 wherein the means for preconditioning samples includes means for alternately selecting applied digital input samples and preconditioned samples as output samples from said means for preconditioning samples.

8. The signal processing system set forth in claim 6 wherein the means for alternately applying the preconditioned samples to the first and second digital-to-analog converters includes:

first, second, third and fourth delay elements, said delay elements respectively having delay periods substantially greater than one sample period and conditioned to write in samples at a first rate and to read out samples at a second rate;

first multiplexing means having an input port and first and second output ports for applying samples applied to said multiplexing means input port alternately to said first and second delay elements;

second multiplexing means having an input port and first and second output ports for applying samples applied to said second multiplexing means input port alternately to said third and fourth delay elements;

third multiplexing means having an input port coupled to said preconditioning means and having first and second output ports respectively coupled to said input ports of said first and second multiplexing means for alternately applying strings of samples to said first and second multiplexing means;

fourth multiplexing means having first and second input ports respectively coupled to said first and third delay elements and having an output port coupled to said first digital-to-analog converter and conditioned to alternately couple strings of delayed samples from said first and third delay elements to said first digital-to-analog converter; and fifth multiplexing means having first and second input ports respectively coupled to said second and fourth delay elements and an output port coupled to said second digital-to-analog converter, and conditioned to alternately couple strings of delayed samples from said second and fourth delay elements to said second digital-to-analog converter.

9. A video signal processing system for processing digital video signals occurring in horizontal image line format with a predetermined sample rate and line rate, comprising:

means for applying said digital video signal samples;

means for increasing the sample and line rate of digital video signal samples;

means for coupling said sample and line rate increasing means to said means for applying digital video signal samples;

first and second digital-to-analog converters having respective signal input ports and respective output terminals;

means coupled to the output terminals of said first and second digital-to-analog converters for summing output signals provided by said first and second converters;

means for coupling the input ports of said first and second digital-to-analog converters to said sample and line rate increasing means, successive signal samples being alternately applied to said first and second digital-to-analog converters, and the respective digital-to-analog converters responsive thereto generating analog output samples which overlap two successive analog output samples provided by the other digital-to-analog converters.

10. The video signal processing system set forth in claim 9 wherein the means for coupling said sample and line rate increasing means to the means for applying digital video signal samples includes means for preconditioning samples and having a transfer function for counteracting loss in signal frequency response attendant summing the output samples provided by said first and second digital-to-analog converters.

11. The video signal processing system set forth in claim 9 wherein the means for coupling said sample and line rate increasing means to the means for applying digital video signal samples comprises means to precondition applied signal according to the transfer function F given by the equation:

$$F = (1 + Z^{-1})^{-1}$$

where Z connotes the conventional Z transform variable.

12. The video signal processing system set forth in claim 9 wherein the means for coupling said sample and line rate increasing means to the means for applying digital video signal samples comprises means to precondition applied signal according to the transfer function F given by the equation:

$$F = (-1 + \beta Z^{-1} - Z^{-2})$$

where Z connotes the conventional Z transform variable and $\beta$ is a scale factor.

13. The video signal processing system set forth in claim 12 wherein the means for coupling said sample and line rate increasing means to the means for applying digital video signal samples includes means coupled to the means to precondition applied signal for normalizing sample values output thereby.

14. The video signal processing system set forth in claim 9 wherein said sample and line rate increasing means comprises:

first, second, third and fourth delay elements, said delay elements respectively having delay periods substantially greater than one sample period and conditioned to write in samples at a first rate and to read out samples at a second rate;

first multiplexing means having an input port and first and second output ports for applying samples applied to said multiplexing means input port alternately to said first and second delay elements;

second multiplexing means having an input port and first and second output ports for applying samples applied to said second multiplexing means input port alternately to said third and fourth delay elements;

third multiplexing means having an input port coupled to said preconditioning means and having first and second output ports respectively coupled to said input ports of said first and second multiplexing means for alternately applying strings of samples to said first and second multiplexing means;

fourth multiplexing means having first and second input ports respectively coupled to said first and third delay elements and having an output port coupled to said first digital-to-analog converter and conditioned to alternately couple strings of delayed samples from said first and third delay elements to said first digital-to-analog converter; and fifth multiplexing means having first and second input ports respectively coupled to said second and fourth delay elements and an output port coupled to said second digital-to-analog converter, and conditioned to alternately couple strings of delayed samples from said second and fourth delay elements to said second digital-to-analog converter.

15. A digital-to-analog converter system including at least two digital-to-analog converters operated in ping pong manner, such that analog samples provided by one of said digital-to-analog converters partially overlaps analog samples provided by at least one of the other of said at least two digital-to-analog converters, and including means for summing output analog samples provided by all of said at least two digital-to-analog converters.

16. The digital-to-analog converter system set forth in claim 15 including means for preconditioning samples applied to said at least two digital-to-analog converters, said preconditioning means having a transfer function for counteracting loss in signal frequency response attendant summing the output samples provided by all of said at least two digital-to-analog converters.

17. The digital-to-analog converter system set forth in claim 15 further including means for preconditioning digital samples applied to the digital-to-analog converter system according to the transfer function F given by the equation $$F = \left( \sum_{i=0}^{N-1} A_i Z^{-i} \right)^{-1}$$

where Z connotes the conventional Z transform variable, N is an integer equal to the number of digital-to-analog converters operated in ping pong manner, and the $A_i$ are coefficient values.

18. The digital-to-analog converter system set forth in claim 15 including means for preconditioning samples applied to said at least two digital-to-analog converters according to the transfer function F given by the equation $F = (-1 + \beta Z^{-1} - Z^{-2})$ where Z connotes the conventional Z transform variable and $\beta$ is a scale factor.

19. The digital-to-analog converter system set forth in claim 18 including means responsive to preconditioned samples for normalizing said samples.

20. The digital-to-analog converter system set forth in claim 18 including means for dividing preconditioned samples by the factor $(\beta - 2)$ and $\beta \neq 2$.

* * * * *